US011387135B2

(12) United States Patent
Cotlear et al.

(10) Patent No.: US 11,387,135 B2
(45) Date of Patent: Jul. 12, 2022

(54) CONDUCTIVE WAFER LIFT PIN O-RING GRIPPER WITH RESISTOR

(71) Applicant: Applied Materials, Inc., Santa Clara, CA (US)

(72) Inventors: Roberto Cesar Cotlear, Sunnyvale, CA (US); Michael D. Willwerth, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 710 days.

(21) Appl. No.: 15/418,656

(22) Filed: Jan. 27, 2017

(65) Prior Publication Data
US 2017/0221750 A1    Aug. 3, 2017

Related U.S. Application Data

(60) Provisional application No. 62/288,288, filed on Jan. 28, 2016.

(51) Int. Cl.
*H01L 21/687* (2006.01)
*H01L 21/683* (2006.01)
*H01J 37/32* (2006.01)

(52) U.S. Cl.
CPC .. *H01L 21/68742* (2013.01); *H01J 37/32715* (2013.01); *H01L 21/6831* (2013.01); *H01J 37/3211* (2013.01); *H01J 37/32183* (2013.01)

(58) Field of Classification Search
CPC .............. C23C 16/458; C23C 16/4586; H01L 21/6831; H01L 21/68742; H01J 37/3211; H01J 37/32183; H01J 37/32715
See application file for complete search history.

(56) References Cited

U.S. PATENT DOCUMENTS

| 5,900,062 | A | * | 5/1999 | Loewenhardt | ...... H01L 21/6831 |
| | | | | | 118/723 R |
| 5,904,779 | A | * | 5/1999 | Dhindsa | ............ H01J 37/32431 |
| | | | | | 118/723 E |
| 6,236,555 | B1 | | 5/2001 | Leeser | |
| 6,646,857 | B2 | | 11/2003 | Anderson et al. | |
| 8,313,612 | B2 | | 11/2012 | McMillin et al. | |
| 8,628,675 | B2 | | 1/2014 | McMillin et al. | |

(Continued)

FOREIGN PATENT DOCUMENTS

| KR | 10-2005-0056751 | * | 6/2005 |
| KR | 20070000686 A | | 1/2007 |
| WO | WO-2014193138 A1 | * | 12/2014 |

*Primary Examiner* — Benjamin Kendall
(74) *Attorney, Agent, or Firm* — Patterson + Sheridan, LLP

(57) ABSTRACT

Embodiments of the present disclosure generally relate to a lift pin assembly used for de-chucking substrates. The lift pin assembly includes a base and one or more lift pin holders. Each lift pin holder includes a first portion and a second portion. The first portion is coupled to the base by a metal connector and the second portion is coupled to the first portion by a metal connector. A resistor is disposed in the first portion of the lift pin holder. The second portion includes a lift pin support for supporting a lift pin. The lift pin, the lift pin support, and the metal connectors are electrically conductive. The base is connected to a reference voltage, such as the ground, forming a path for the residual electrostatic charge in the substrate from the substrate to the reference voltage.

23 Claims, 4 Drawing Sheets

(56) References Cited

U.S. PATENT DOCUMENTS

| | | | |
|---|---|---|---|
| 9,011,602 B2* | 4/2015 | Hao | H01L 21/68742 |
| | | | 118/728 |
| 9,025,305 B2 | 5/2015 | Cooke et al. | |
| 2003/0136341 A1* | 7/2003 | Na | H01L 21/68742 |
| | | | 118/500 |
| 2005/0092438 A1* | 5/2005 | Hur | H01L 21/68742 |
| | | | 156/345.47 |
| 2006/0156988 A1* | 7/2006 | Wu | H01L 21/68742 |
| | | | 118/728 |
| 2006/0238953 A1* | 10/2006 | Hanawa | H01L 21/6831 |
| | | | 361/234 |
| 2007/0212200 A1* | 9/2007 | Ueda | H01L 21/68742 |
| | | | 414/217 |
| 2010/0101491 A1* | 4/2010 | Aida | H01L 21/68742 |
| | | | 118/502 |
| 2010/0109263 A1 | 5/2010 | Jun et al. | |
| 2011/0236162 A1* | 9/2011 | Shikayama | H01L 21/68742 |
| | | | 414/222.01 |
| 2014/0231389 A1* | 8/2014 | Nagami | H01J 37/32091 |
| | | | 216/67 |
| 2015/0059974 A1* | 3/2015 | Boyd, Jr. | C23C 16/4581 |
| | | | 156/280 |
| 2017/0133260 A1* | 5/2017 | Pohl | H01L 21/68742 |

* cited by examiner

CONDUCTIVE WAFER LIFT PIN O-RING GRIPPER WITH RESISTOR

CROSS-REFERENCE TO RELATED APPLICATIONS

This application claims priority to U.S. Provisional Patent Application Ser. No. 62/288,288, filed on Jan. 28, 2016, which herein is incorporated by reference.

BACKGROUND

Field

Embodiments of the present disclosure generally relate to apparatus for forming a semiconductor device. More particularly, embodiments described herein relate to a lift pin assembly used for de-chucking substrates.

Description of the Related Art

In semiconductor processing, lift pins are used to lift and lower a semiconductor substrate onto a chuck that is used to hold the substrate in a process chamber. Typically, a robotic arm transports the substrate into an upper portion of the process chamber where the substrate is deposited on lift pins that extend upwardly through the chuck. The lift pins are then lowered into a lower portion of the process chamber to place the substrate on the chuck. Thereafter, the robotic arm is withdrawn from the chamber.

Electrostatic chucks are often used to electrostatically attract and hold the substrate in the process chamber during processing of the substrate. Electrostatic chucks are either monopolar or bipolar chucks. A monopolar electrostatic chuck has a single electrode which operates in conjunction with a plasma formed in the process chamber to accumulate opposing electrostatic charge in the substrate and the electrode. A bipolar chuck can be used in non-plasma processes, and typically includes two or more electrodes which are maintained at opposing electric potentials to induce opposing electrostatic charge in the electrodes and substrate. The opposing electrostatic charges in the substrate and the electrodes of the chuck cause the substrate to be electrostatically held to the chuck. Typically, the electrodes of the chuck are electrically biased with respect to the substrate by a DC voltage or a low frequency AC voltage.

After processing of the substrate, the DC voltage applied to the chuck electrode is terminated to release the substrate, and the lift pins are raised upward through holes in the chuck to lift the substrate off the chuck by pushing up against the substrate. The robotic arm is then reinserted below the substrate to withdraw the processed substrate from the chamber.

One problem with conventional lift pins arises when the lift pins attempt to lift the substrate off the chuck. Residual electrostatic charge in the substrate generates attractive electrostatic forces between the substrate and the chuck, which cause the substrate to adhere to the chuck, even when the voltage to the chuck is terminated. The upwardly pushing lift pins can damage or break the substrate.

Therefore, an improved lift pin assembly is needed.

SUMMARY

Embodiments of the present disclosure generally relate to a lift pin assembly used for de-chucking substrates. The lift pin assembly includes a base and one or more lift pin holders. Each lift pin holder includes a first portion and a second portion. The first portion is coupled to the base by a metal connector and the second portion is coupled to the first portion by a metal connector. A resistor is disposed in the first portion of the lift pin holder. The second portion includes a lift pin support for supporting a lift pin. The lift pin, the lift pin support, and the metal connectors are electrically conductive. The base is connected to a reference voltage, such as the ground, forming a path for the residual electrostatic charge in the substrate from the substrate to the reference voltage.

In one embodiment, a lift pin assembly includes a base and a plurality of lift pin holders. Each lift pin holder includes a first portion coupled to the base by a first metal connector, a resistor disposed within the first portion, and a second portion coupled to the first portion by a second metal connector.

In another embodiment, a lift pin assembly includes a base and a plurality of lift pin holders. Each lift pin holder includes a first portion coupled to the base by a first metal stud, a resistor disposed within the first portion, and a second portion coupled to the first portion by a second metal stud.

In another embodiment, a plasma processing chamber includes a bottom, a sidewall, a lid disposed over the sidewall, the bottom, the sidewall and the lid define a processing volume, and a substrate support assembly disposed in the processing volume. The substrate support assembly includes a substrate support and a lift pin assembly. The lift pin assembly includes a base and a plurality of lift pin holders. Each lift pin holder includes a first portion coupled to the base by a first metal connector, a resistor disposed within the first portion, and a second portion coupled to the first portion by a second metal connector.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
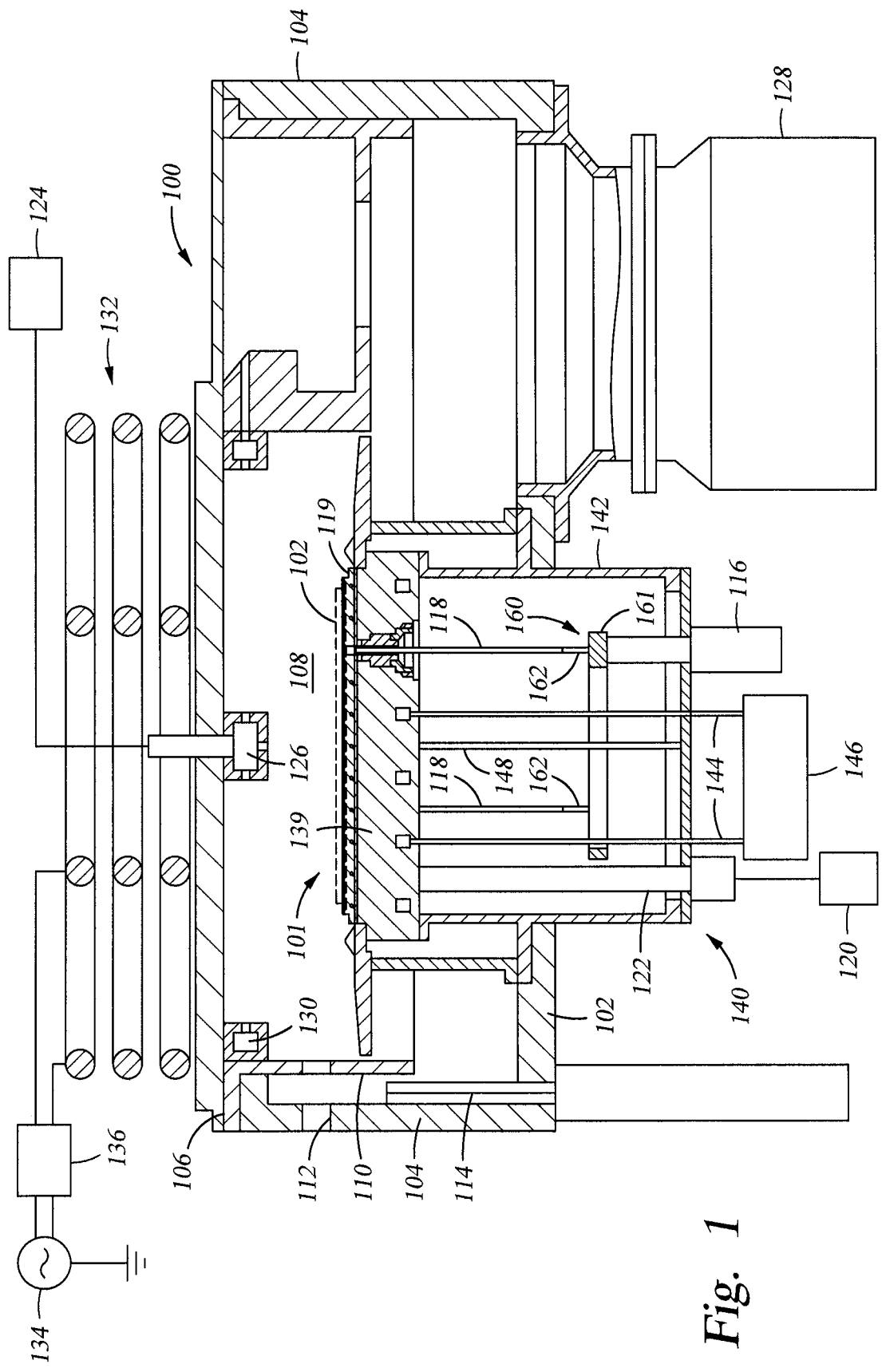
FIG. 1 illustrates a schematic, cross-sectional view of a plasma processing chamber within which embodiments of the disclosure may be performed.

FIG. 1 is a schematic, cross-sectional view of a plasma processing chamber 100 within which the method described herein may be performed. The substrate support assembly 101 may be used to support a variety of substrates, such as semiconductor substrates and reticles. The substrate support assembly 101 may include an electro-static chuck assembly.

The plasma processing chamber 100 includes a bottom 102, a sidewall 104 and a chamber lid 106 disposed over the sidewall 104 defining a processing volume 108. The plasma processing chamber 100 further includes a liner 110 disposed in the processing volume 108 to prevent the sidewall 104 from damage and contamination from the processing chemistry and/or processing by-products. A slit valve door opening 112 is formed through the sidewall 104 and the liner 110 to allow passage of the substrates and substrate transfer mechanism disposed in a system, such as a cluster tool (as described in FIG. 2) that is coupled to the plasma processing chamber 100. A slit valve door 114 selectively open and close the slit valve door opening 112.

The substrate support assembly 101, which includes a substrate support 139 and a connection region 140, is disposed in the processing volume 108 and is supported by support(s) 142. The substrate support 139 may be an electrostatic chuck. A lift 116 is configured to raise and lower lift pins 118 disposed on a lift pin assembly 160 relative to the substrate support assembly 101 during processing and loading/unloading the substrate 102. The lift pin assembly 160 includes a base 161 and a plurality of lift pin holders 162. The connection region 140 of the substrate support assembly 101 is generally not in fluid communication with the processing volume 108. The connection region 140 includes a plurality of electrical connections (e.g., thermocouple wires, heater element wires, shielded e-chuck electrode wires, etc.) and tubes for transferring fluid through the substrate support assembly 101. In one embodiment, the connection region 140 includes the support(s) 142, cooling tubes 144 and electrical connections 122. In one configuration, the electrical connections 122 are used to couple the substrate support assembly 101 to a bias power source 120 for generating chucking force to secure the substrate 102 on the substrate support assembly 101. One or more heating elements 119, such as resistive heating elements, may be embedded in the substrate support 139 for heating and maintaining the substrate 102 to a predetermined temperature. The one or more heating elements 119 may be used to heat the substrate 102 to a temperature up to about 650 degrees Celsius. The connection region 140 may also include cooling tubes 144 for flowing a coolant (e.g., DI water) through the substrate support 139. The cooling tubes are connected to a heat exchanger 146. A temperature measuring device 148 may be coupled to the substrate support assembly 101.

One or more processing gases may be supplied to the processing volume 108 from a gas source 124 via an inlet 126. A vacuum pump 128 is in fluid communication with the processing volume 108. The vacuum pump 128 may be used to pump the processing volume 108 and maintain a low pressure environment through a plenum 130.

The plasma processing chamber 100 includes an antenna assembly 132 disposed outside the chamber lid 106. The antenna assembly 132 may be coupled to a radio-frequency (RF) plasma power source 134 through a matching network 136. During processing, the antenna assembly 132 is energized with RF power provided by the power source 134 to ignite the processing gases within the processing volume 108 to form a plasma and to maintain the plasma during processing of the substrate 102.

The plasma processing chamber 100 may be used for various plasma processes. In one embodiment, the plasma processing chamber 100 may be used to break oxygen bonds in an oxide layer, converting the oxide layer to an evaporable layer, evaporating the evaporable layer, and forming an oxide layer. The above mentioned processes can be performed in the plasma processing chamber 100, which leads to a reduced processing time.

Figure 2:
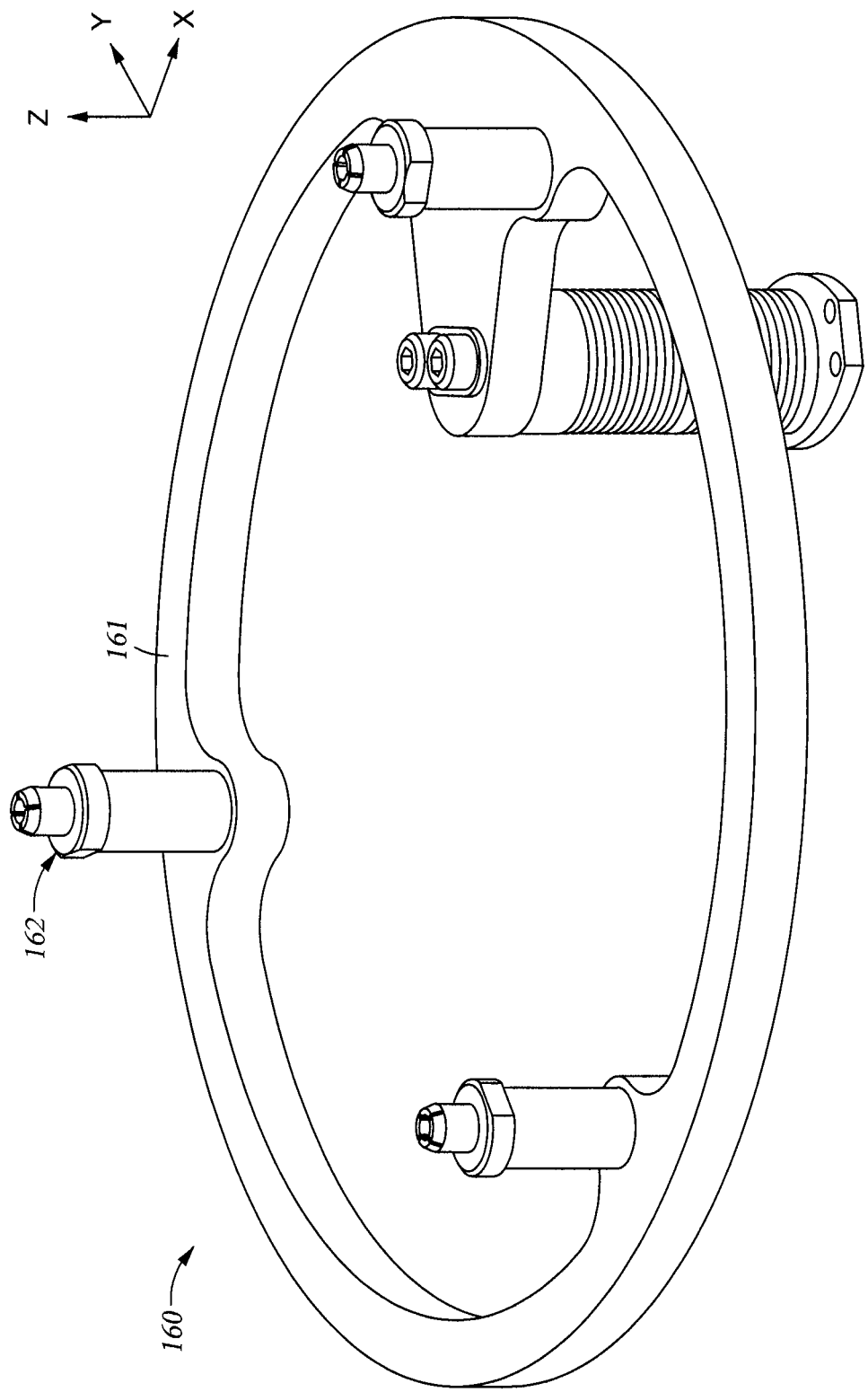
FIG. 2 illustrates a perspective view of a lift pin assembly according to embodiments disclosed herein.

FIG. 2 illustrates a perspective view of the lift pin assembly 160 according to embodiments disclosed herein. As shown in FIG. 2, the lift pin assembly 160 includes the base 161 and a plurality of lift pin holders 162. The base 161 may have any suitable shape, such as circular. The base 161 may have the same shape as the substrate to be processed in the processing chamber 100. The base 161 may be annular, as shown in FIG. 2. Each lift pin holder 162 is configured to support a lift pin 118. The number of lift pins 118 and lift pin holders 162 may vary based on the configuration of the processing chamber 100. In one embodiment, there are three lift pin holders 162 disposed on the base 161 for supporting three lift pins 118.

Figure 3:
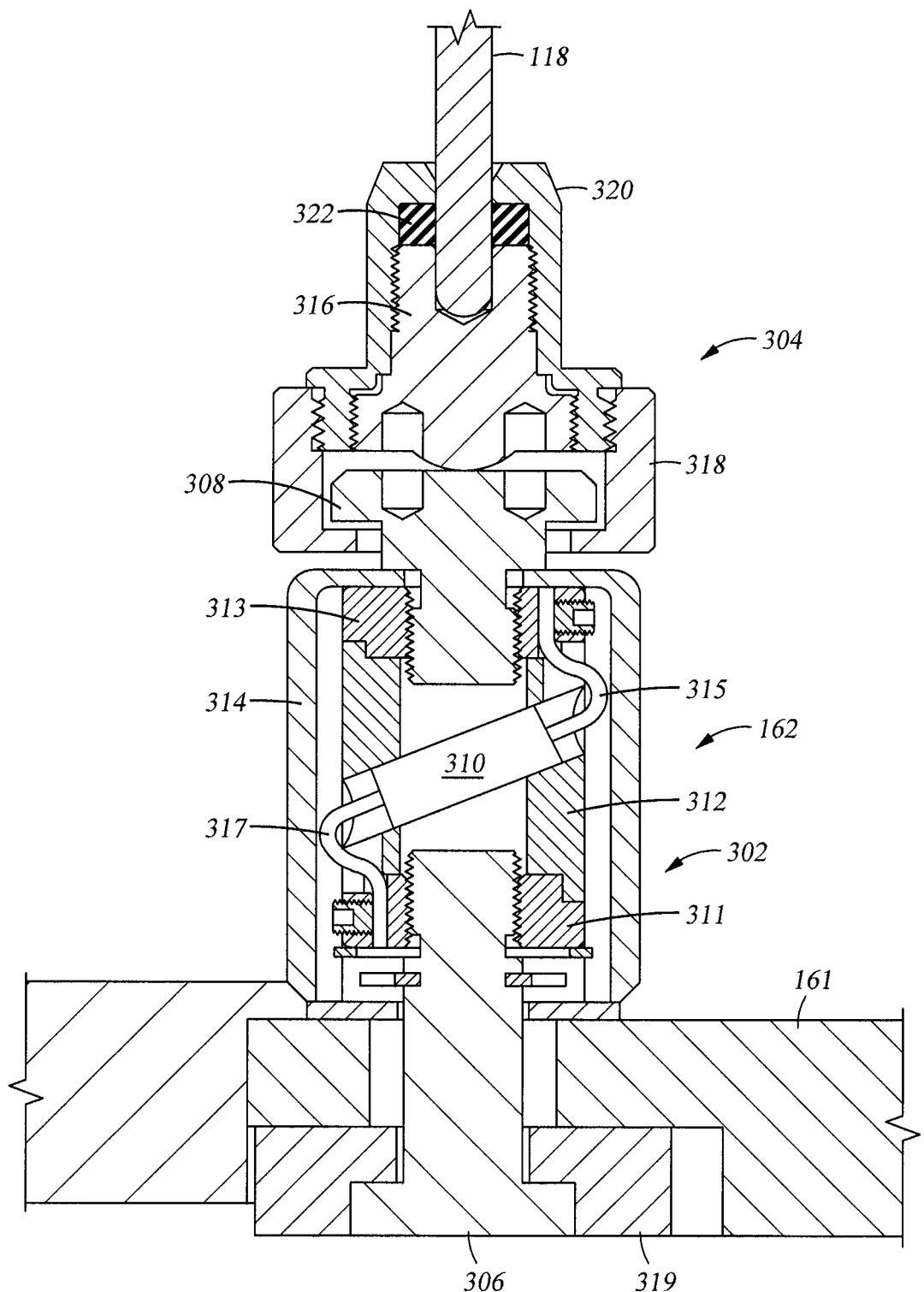
FIG. 3 illustrates a cross-sectional view of a lift pin holder according to embodiments disclosed herein.

FIG. 3 illustrates a cross-sectional view of the lift pin holder 162 according to embodiments disclosed herein. As shown in FIG. 3, the lift pin holder 162 includes a first portion 302 and a second portion 304. The first portion 302 may be electrically coupled to the base 161 by a metal connector 306, and the second portion 304 may be electrically coupled to the first portion 302 by a metal connector 308. The metal connectors 306, 308 may be any suitable connectors, such as metal studs. A resistor 310 may be disposed in the first portion 302 of the lift pin holder 162. The resistor 310 may be any suitable resistor for reducing currents flowing therethrough. In one embodiment, the resistor 310 may be a 10 mega-ohm resistor. The resistor 310 may be electrically coupled to conductive members 311, 313 via conductive wires 317, 315, respectively. The conductive members 311, 313 may be electrically coupled to the metal connectors 306, 308, respectively. The metal connector 306 may be electrically coupled to the base 161 via another conductive member 319. The resistor 310 may be disposed within a dielectric tube 312. The dielectric tube 312 may be made of any suitable dielectric material, such as polytetrafluoroethylene. The first portion 302 of the lift pin holder 162 may also include a cover 314. The cover 314 may be made of a dielectric material, such as plastic, for protecting the resistor 310. The first portion 302 of the lift pin holder 162 may be easily separated from the metal connectors 306, 308 in case the resistor 310 should be replaced.

The second portion 304 of the lift pin holder 162 may include a lift pin support 316 that is electrically coupled to the metal connector 308. The lift pin 118 may be disposed in a recess formed in the lift pin support 316. A cap 320 may be coupled to the lift pin support 316 to secure the lift pin 118, and an o-ring 322 may be placed between the cap 320 and the lift pin support 316 to further secure the lift pin 118. The cap 320 may be supported by a cover 318, which is also electrically coupled to the metal connector 308. The cap 320, cover 318, lift pin support 316, metal connectors 306, 308, conductive members 311, 313, and conductive wires 315, 317 may be made of an electrically conductive material, such as stainless steel. During operation, as the lift pins 118 contact the substrate, the residual electrostatic charge in the substrate is discharged by flowing the current through the lift pin 118 and the conductive portions of the lift pin holder 162, reaching the grounded base 161.

Figure 4:
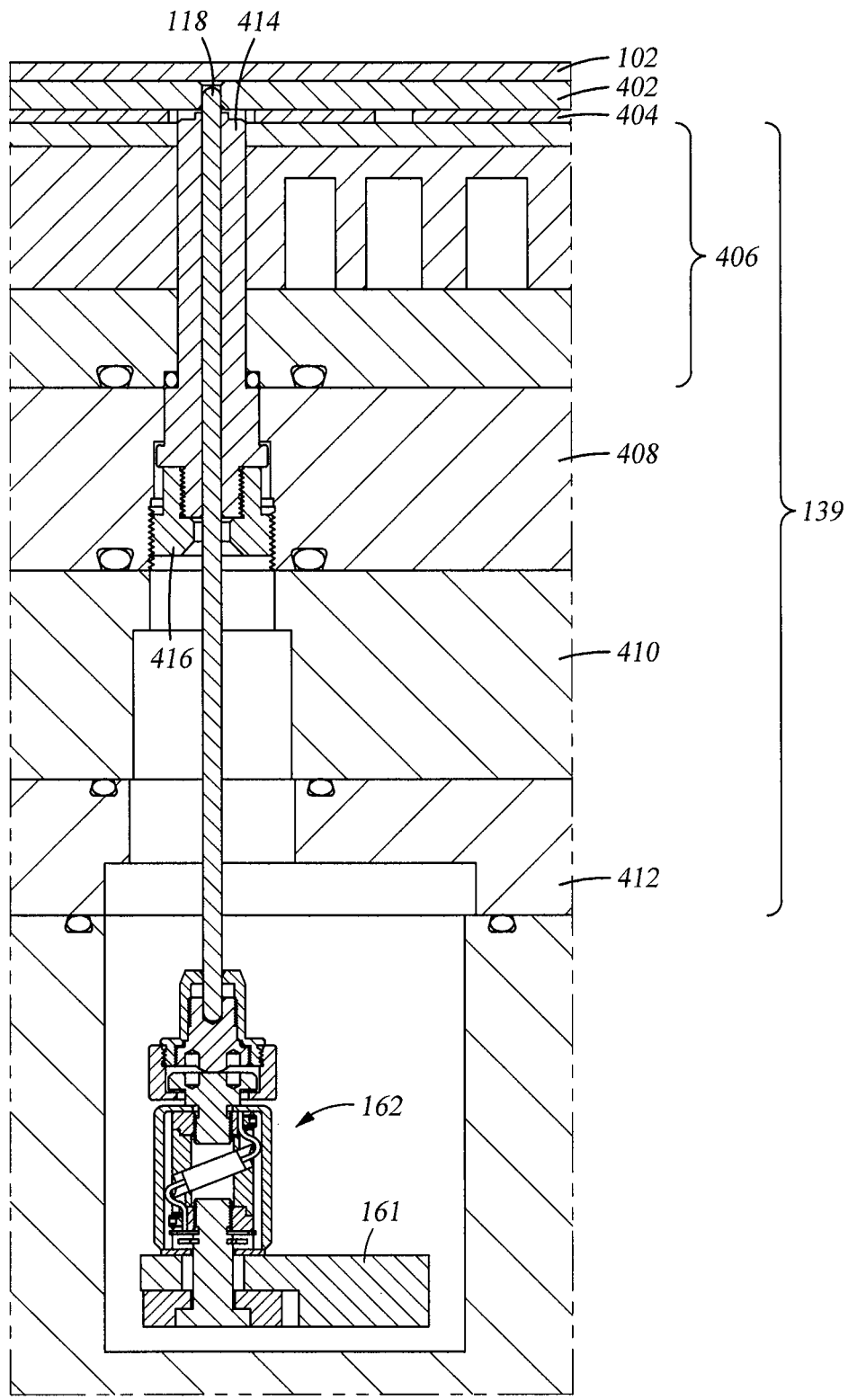
FIG. 4 illustrates a cross-sectional view of the lift pin holder, a lift pin, and a substrate support according to embodiments disclosed herein.

FIG. 4 illustrates a cross-sectional view of the lift pin holder 162, the lift pin 118, and the substrate support 139 according to embodiments disclosed herein. As shown in FIG. 4, the lift pin 118 is located within an opening formed in the substrate support 139. The substrate support 139 may include a plurality of layers, such as a ceramic layer 402 for supporting the substrate 102, a cooling plate 406 coupled to the ceramic layer 402 by a bonding layer 404, another cooling plate 408, an insulating plate 410, and a ground plate 412. A lift pin guide 414 may be disposed in the substrate support 139, and the lift pin guide 414 may be supported by a ceramic retainer 416. The lift pin guide 414 may be made of a dielectric material, such as plastic.

While the foregoing is directed to embodiments of the present disclosure, other and further embodiments of the disclosure may be devised without departing from the basic scope thereof, and the scope thereof is determined by the claims that follow.

What is claimed is:

1. A lift pin assembly, comprising:
   a base; and
   a plurality of lift pin holders, wherein each lift pin holder comprises:
      a first portion electrically coupled to the base by a first metal connector;
      a resistor disposed within a dielectric tube in the first portion;
      a second portion electrically coupled to the first portion by a second metal connector; and
      a first conductive member in the first portion coupled to the first metal connector and a second conductive member in the first portion coupled to the second metal connector;
      wherein the first portion includes a dielectric cover disposed about the dielectric tube, the dielectric cover separated from the dielectric tube by a circumferential gap.

2. The lift pin assembly of claim 1, wherein the base is annular.

3. The lift pin assembly of claim 1, wherein the resistor is coupled to the first conductive member via a first conductive wire in the first portion and coupled to the second conductive member via a second conductive wire in the first portion.

4. The lift pin assembly of claim 3, wherein the dielectric tube is disposed between the first conductive member and the second conductive member.

5. The lift pin assembly of claim 4, wherein the dielectric tube comprises polytetrafluoroethylene.

6. The lift pin assembly of claim 1, wherein the second portion includes:
   a lift pin support electrically coupled to the second metal connector and including a recess configured to receive an end of a lift pin;
   a cap coupled to the lift pin support; and
   an o-ring disposed between the cap and the lift pin support, the o ring configured to hold the lift pin.

7. The lift pin assembly of claim 1, wherein the dielectric cover encloses an uppermost surface of the second conductive member.

8. A lift pin assembly, comprising:
   a base; and
   a plurality of lift pin holders, wherein each lift pin holder comprises:
      a first portion electrically coupled to the base by a first metal stud;
      a resistor disposed within the first portion;
      a second portion electrically coupled to the first portion by a second metal stud; and
      a first conductive member in the first portion coupled to the first metal stud and a second conductive member in the first portion coupled to the second metal stud;
      wherein the first portion includes a dielectric cover disposed about the resistor and the second conductive member, the dielectric cover enclosing an uppermost surface of the second conductive member.

9. The lift pin assembly of claim 8, wherein the base is annular.

10. The lift pin assembly of claim 8, wherein the resistor is coupled to the first conductive member via a first conductive wire and coupled to the second conductive member via a second conductive wire.

11. The lift pin assembly of claim 10, wherein each lift pin holder further comprises a dielectric tube disposed between the first conductive member and the second conductive member.

12. The lift pin assembly of claim 11, wherein the dielectric tube comprises polytetrafluoroethylene.

13. The lift pin assembly of claim 11, wherein the resistor is disposed within the dielectric tube.

14. The lift pin assembly of claim 13, wherein the dielectric cover extends beyond the dielectric tube.

15. The lift pin assembly of claim 13, further comprising a circumferential gap between the dielectric cover and the dielectric tube.

16. The lift pin assembly of claim 8, wherein the second portion includes:
   a lift pin support electrically coupled to the second metal connector and including a recess configured to receive an end of a lift pin;
   a cap coupled to the lift pin support; and
   an o-ring disposed between the cap and the lift pin support, the o ring configured to hold the lift pin.

17. The lift pin assembly of claim 8, wherein the second conductive member is disposed entirely within the dielectric cover.

18. A plasma processing chamber, comprising:
   a bottom;
   a sidewall;
   a lid disposed over the sidewall, wherein the bottom, the sidewall and the lid define a processing volume; and
   a substrate support assembly disposed in the processing volume, wherein the substrate support assembly comprises:
      a substrate support; and
      a lift pin assembly, comprising:
         a base; and
         a plurality of lift pin holders, wherein each lift pin holder comprises:
            a first portion electrically coupled to the base by a first metal connector;
            a resistor disposed within a dielectric tube in the first portion;
            a second portion electrically coupled to the first portion by a second metal connector; and
            a first conductive member in the first portion coupled to the first metal connector and a second conductive member in the first portion coupled to the second metal connector;
         wherein the first portion includes a dielectric cover disposed about the dielectric tube, the dielectric cover separated from the dielectric tube by a circumferential gap.

19. The plasma processing chamber of claim 18, wherein the base is annular.

20. The plasma processing chamber of claim 18, wherein the resistor is coupled to the first conductive member via a first conductive wire and coupled to the second conductive member via a second conductive wire.

21. The plasma processing chamber of claim 20, wherein the dielectric tube is disposed between the first conductive member and the second conductive member.

22. The plasma processing chamber of claim 20, wherein the dielectric tube comprises polytetrafluoroethylene.

23. The plasma processing chamber of claim 18, wherein the second portion includes:
- a lift pin support electrically coupled to the second metal connector and including a recess configured to receive an end of a lift pin;
- a cap coupled to the lift pin support; and
- an o-ring disposed between the cap and the lift pin support, the o ring configured to hold the lift pin.

* * * * *